(12) United States Patent
Wang (10) Patent No.: US 11,544,528 B2
(45) Date of Patent: Jan. 3, 2023

(54) HOMEOSTATIC CIRCUIT FOR NEURAL NETWORKS

(71) Applicant: Rongxue Wang, Hong Kong (HK)

(72) Inventor: Rongxue Wang, Hong Kong (HK)

(73) Assignee: Dongguan Bang Bang Tang Electronic Technologies Co., Ltd., Guangdong (CN)

(*) Notice: Subject to any disclaimer, the term of this patent is extended or adjusted under 35 U.S.C. 154(b) by 1000 days.

(21) Appl. No.: 16/244,125

(22) Filed: Jan. 10, 2019

(65) Prior Publication Data

US 2019/0164041 A1    May 30, 2019

(51) Int. Cl.
*G06N 3/04*     (2006.01)
*H03K 17/687*   (2006.01)

(52) U.S. Cl.
CPC ........ *G06N 3/0445* (2013.01); *H03K 17/6872* (2013.01)

(58) Field of Classification Search
CPC .... G06N 3/0445; G06N 3/0635; G06N 3/063; H03K 17/6872; H03K 17/6871; H03K 17/6874
See application file for complete search history.

(56) References Cited

U.S. PATENT DOCUMENTS

| | | | |
|---|---|---|---|
| 5,075,869 A | 12/1991 | Holler et al. | |
| 2012/0016829 A1* | 1/2012 | Snider | G06N 3/063 706/27 |
| 2019/0171933 A1 | 6/2019 | Lee et al. | |

FOREIGN PATENT DOCUMENTS

JP    H03-214277 A    9/1991

\* cited by examiner

*Primary Examiner* — Jung Kim (57) ABSTRACT

A homeostatic circuit for neural networks includes a feedback circuit, a first electronic switch, a synapse circuit, a second electronic switch, a third electronic switch and a first capacitor. The feedback circuit is configured to receive the total synaptic driving current and output a feedback voltage which varies with the total synaptic driving current. The first electronic switch is connected with the synapse circuit and the second electronic switch and configured to receive the feedback voltage and output a current control signal according to the feedback voltage. The second electronic switch is connected with the synapse circuit and the third electronic switch and configured to output a first voltage signal according to the current control signal. The third electronic switch is configured to adjust the total synaptic driving current in a direction opposite to variation tendency of the total synaptic driving current according to the first voltage signal.

20 Claims, 4 Drawing Sheets

HOMEOSTATIC CIRCUIT FOR NEURAL NETWORKS

FIELD OF THE PATENT APPLICATION

The present patent application generally relates to medical electronics and more specifically to a homeostatic circuit for neural networks.

BACKGROUND

The hardware implementation of a neural network system requires that a circuit should work against the drifts produced by the neural network system under the influence of certain external conditions. For example, when the temperature varies, the input of the system may vary. In order to realize the stable operation of the neural network, the circuit must take proper homeostatic actions to adapt to such variations and keep the system working around an operating point. A feature of the aforementioned variations is that the time scale is relatively long, which requires that the time period for the homeostatic actions of the circuit should be relatively long. Otherwise, the homeostatic actions will interfere with the signal processing or learning mechanism of the neural network.

Conventional homeostatic actions for neural networks are generally realized by floating gate transistors or software control and often require an external memory and a processor at the same time, which leads to high power consumption, high cost and difficulty in realizing large-scale and high-density integration with other artificial neural computing systems.

SUMMARY

The present patent application is directed to a homeostatic circuit for neural networks configured to keep a total synaptic driving current in a predetermined range around an optimal operating point. In one aspect, the homeostatic circuit for neural networks includes a feedback circuit; a first electronic switch; a synapse circuit; a second electronic switch; a third electronic switch; a first capacitor; and a fourth electronic switch. The feedback circuit is configured to receive the total synaptic driving current and output a feedback voltage which varies with the total synaptic driving current. The first electronic switch is electrically connected with the synapse circuit and the second electronic switch and configured to receive the feedback voltage and output a current control signal according to the feedback voltage. The gate electrode of the first electronic switch is electrically connected with the feedback circuit. The second electronic switch is electrically connected with the synapse circuit and the third electronic switch and configured to output a first voltage signal according to the current control signal. The drain electrode of the third electronic switch is electrically connected with the feedback circuit. The third electronic switch is configured to adjust the total synaptic driving current in a direction opposite to variation tendency of the total synaptic driving current according to the first voltage signal so as to keep the total synaptic driving current in the predetermined range. One end of the first capacitor is electrically connected with a power supply voltage while the other end of the first capacitor is electrically connected with the third electronic switch. The total synaptic driving current is produced by the integrating effect of the homeostatic circuit for neural networks through the first capacitor. The fourth electronic switch is electrically connected with the second electronic switch and configured to provide a constant current for the second electronic switch so that variation tendency of the first voltage signal is the same as variation tendency of the current control signal. The feedback circuit includes a comparator and a control voltage generator which are electrically connected with each other. The comparator includes a first input port, a second input port and an output port. The first input port is configured to receive a reference current, the second input port being configured to receive the total synaptic driving current and the output port being configured to output a second voltage signal. The control voltage generator is configured to receive the second voltage signal and produce the feedback voltage. The control voltage generator includes a fifth electronic switch, a first voltage module, a second voltage module, a third voltage module and a second capacitor, the fifth electronic switch being electrically connected with the first voltage module, the second voltage module, the third voltage module and the second capacitor. The first voltage module is configured to provide a first comparison voltage for the fifth electronic switch. The second voltage module is configured to provide a second comparison voltage for the fifth electronic switch. The third voltage module is configured to control conducting state of the fifth electronic switch. The second capacitor is configured to output the feedback voltage. When the first comparison voltage is greater than the second comparison voltage, the second capacitor is controlled by the fifth electronic switch to be charged. When the first comparison voltage is lower than the second comparison voltage, the fifth electronic switch controls the second capacitor to be discharged so as to control the feedback voltage to vary slowly.

The first electronic switch and the second electronic switch may be N-type Metal-Oxide Semiconductor Field Effect Transistors while the third electronic switch, the fourth electronic switch and the fifth electronic switch may be P-type Metal-Oxide Semiconductor Field Effect Transistors.

In another aspect, the present patent application provides a homeostatic circuit for neural networks. The homeostatic circuit for neural networks includes a feedback circuit; a first electronic switch; a synapse circuit; a second electronic switch; a third electronic switch; and a first capacitor. The feedback circuit is configured to receive the total synaptic driving current and output a feedback voltage varying with the total synaptic driving current. The first electronic switch is electrically connected with the synapse circuit and the second electronic switch and configured to receive the feedback voltage and output a current control signal according to the feedback voltage. The gate electrode of the first electronic switch is electrically connected with the feedback circuit. The second electronic switch is electrically connected with the synapse circuit and the third electronic switch and configured to output a first voltage signal according to the current control signal. The drain electrode of the third electronic switch is electrically connected with the feedback circuit. The third electronic switch is configured to adjust the total synaptic driving current in a direction opposite to variation tendency of the total synaptic driving current according to the first voltage signal so as to keep the total synaptic driving current in the predetermined range. One end of the first capacitor is electrically connected with a power supply voltage while the other end of the first capacitor is electrically connected with the third electronic switch. The total synaptic driving current is produced by the integrating effect of the homeostatic circuit for neural networks through the first capacitor.

Variation tendency of the feedback voltage, the current control signal and the first voltage signal may be the same as variation tendency of the total synaptic driving current. The homeostatic circuit for neural networks may further include a fourth electronic switch. The fourth electronic switch may be electrically connected with the second electronic switch and configured to provide a constant current for the second electronic switch so that variation tendency of the first voltage signal may be the same as variation tendency of the current control signal.

The first electronic switch and the second electronic switch may be N-type Metal-Oxide Semiconductor Field Effect Transistors. The third electronic switch and the fourth electronic switch may be P-type Metal-Oxide Semiconductor Field Effect Transistors. The drain electrode of the first electronic switch may be electrically connected with a power supply voltage, and the source electrode of the first electronic switch may be electrically connected with the synapse circuit. The gate electrode of the second electronic switch may be electrically connected with the gate electrode of the third electronic switch, the drain electrode of the second electronic switch may be electrically connected with the drain electrode of the fourth electronic switch, and the source electrode of the second electronic switch may be electrically connected with the synapse circuit. The source electrode of the third electronic switch may be electrically connected with the power supply voltage. The gate electrode of the fourth electronic switch may be electrically connected with a first biasing voltage and the source electrode of the fourth electronic switch may be electrically connected with the power supply voltage.

The feedback circuit may include a comparator and a control voltage generator which may be electrically connected with each other. The comparator may include a first input port, a second input port and an output port. The first input port may be configured to receive a reference current. The second input port may be configured to receive the total synaptic driving current. The output port may be configured to output a second voltage signal. The control voltage generator may be configured to receive the second voltage signal and produce the feedback voltage.

The control voltage generator may include a fifth electronic switch, a first voltage module, a second voltage module, a third voltage module and a second capacitor, the fifth electronic switch being electrically connected with the first voltage module, the second voltage module, the third voltage module and the second capacitor. The first voltage module may be configured to provide a first comparison voltage for the fifth electronic switch. The second voltage module may be configured to provide a second comparison voltage for the fifth electronic switch. The third voltage module may be configured to control conducting state of the fifth electronic switch. The second capacitor may be configured to output the feedback voltage. When the first comparison voltage may be greater than the second comparison voltage, the second capacitor may be controlled by the fifth electronic switch to be charged. When the first comparison voltage may be lower than the second comparison voltage, the fifth electronic switch may control the second capacitor to be discharged so as to control the feedback voltage to vary slowly.

The first voltage module may include a sixth electronic switch, a seventh electronic switch, a first amplifier and an eighth electronic switch. The second voltage module may include a second amplifier. The third voltage module may include a ninth electronic switch. The fifth electronic switch, the sixth electronic switch, the eighth electronic switch and the ninth electronic switch may be P-type Metal-Oxide Semiconductor Field Effect Transistors. The seventh electronic switch may be an N-type Metal-Oxide Semiconductor Field Effect Transistor. The source electrode of the fifth electronic switch may be electrically connected with the first voltage module. The drain electrode of the fifth electronic switch may be electrically connected with the second voltage module and the second capacitor. The gate electrode of the fifth electronic switch may be electrically connected with the third voltage module. The gate electrode of the sixth electronic switch may receive the second voltage signal. The source electrode of the sixth electronic switch may receive a first predetermined voltage. The drain electrode of the sixth electronic switch may be electrically connected with the positive input port of the first amplifier. The gate electrode of the seventh electronic switch may receive the second voltage signal. The drain electrode of the seventh electronic switch may receive a second predetermined voltage. The source electrode of the seventh electronic switch may be electrically connected with the positive input port of the first amplifier. The negative input port of the first amplifier may be electrically connected with the output port of the first amplifier and the source electrode of the eighth electronic switch.

The gate electrode of the eighth electronic switch may receive a reset voltage; the drain electrode of the eighth electronic switch may be electrically connected with the source electrode of the fifth electronic switch. The negative input port of the second amplifier may be electrically connected with the drain electrode of the fifth electronic switch; the positive input port of the second amplifier may receive a reference voltage; the output port of the second amplifier may be electrically connected with a port of the second capacitor which outputs the feedback voltage. The gate electrode of the ninth electronic switch may receive the reset voltage; the source electrode of the ninth electronic switch may receive a second biasing voltage; the drain electrode of the ninth electronic switch may be electrically connected with the gate electrode of the fifth electronic switch.

The control voltage generator may further include a reset module. The reset module may be electrically connected with the second capacitor and configured to discharge the second capacitor completely so as to deplete the charges of the second capacitor and reset the second capacitor. The reset module may include a tenth electronic switch and an eleventh electronic switch. The tenth electronic switch may be an N-type Metal-Oxide Semiconductor Field Effect Transistor while the eleventh electronic switch may be a P-type Metal-Oxide Semiconductor Field Effect Transistor. The gate electrode of the tenth electronic switch may receive the reset voltage, the source electrode of the tenth electronic switch may be connected to the ground, and the drain electrode of the tenth electronic switch may be electrically connected with the gate electrode of the fifth electronic switch. The gate electrode of the eleventh electronic switch may receive a reversed voltage of the reset voltage, the source electrode of the eleventh electronic switch may be electrically connected with the source electrode of the fifth electronic switch, the drain electrode of the eleventh electronic switch may be electrically connected with a port of the second capacitor which outputs the feedback voltage. When the tenth electronic switch and the eleventh electronic switch may be conducted, the second capacitor may be discharged. When discharging of the second capacitor may be finished, the tenth electronic switch and the eleventh electronic switch may be disconnected.

In yet another aspect, the present patent application provides a homeostatic circuit for neural networks. The homeostatic circuit for neural networks includes a feedback circuit; a first electronic switch; a synapse circuit; a second electronic switch; a third electronic switch; and a first capacitor. The first electronic switch is electrically connected with the synapse circuit and the second electronic switch and configured to receive the feedback voltage and output a current control signal according to the feedback voltage. The gate electrode of the first electronic switch is electrically connected with the feedback circuit. The second electronic switch is electrically connected with the synapse circuit and the third electronic switch and configured to output a first voltage signal according to the current control signal. The drain electrode of the third electronic switch is electrically connected with the feedback circuit. The third electronic switch is configured to adjust the total synaptic driving current in a direction opposite to variation tendency of the total synaptic driving current according to the first voltage signal so as to keep the total synaptic driving current in the predetermined range.

One end of the first capacitor is electrically connected with a power supply voltage while the other end of the first capacitor is electrically connected with the third electronic switch.

The feedback circuit may be configured to receive the total synaptic driving current and output a feedback voltage varying with the total synaptic driving current. The total synaptic driving current may be produced by the integrating effect of the homeostatic circuit for neural networks through the first capacitor. Variation tendency of the feedback voltage, the current control signal and the first voltage signal may be the same as variation tendency of the total synaptic driving current.

The homeostatic circuit for neural networks may further include a fourth electronic switch. The fourth electronic switch may be electrically connected with the second electronic switch and configured to provide a constant current for the second electronic switch so that variation tendency of the first voltage signal may be the same as variation tendency of the current control signal.

The first electronic switch and the second electronic switch may be N-type Metal-Oxide Semiconductor Field Effect Transistors. The third electronic switch and the fourth electronic switch may be P-type Metal-Oxide Semiconductor Field Effect Transistors. The drain electrode of the first electronic switch may be electrically connected with a power supply voltage, and the source electrode of the first electronic switch may be electrically connected with the synapse circuit. The gate electrode of the second electronic switch may be electrically connected with the gate electrode of the third electronic switch, the drain electrode of the second electronic switch may be electrically connected with the drain electrode of the fourth electronic switch, and the source electrode of the second electronic switch may be electrically connected with the synapse circuit. The source electrode of the third electronic switch may be electrically connected with the power supply voltage. The gate electrode of the fourth electronic switch may be electrically connected with a first biasing voltage and the source electrode of the fourth electronic switch may be electrically connected with the power supply voltage.

The feedback circuit may include a comparator and a control voltage generator which are electrically connected with each other. The comparator may include a first input port, a second input port and an output port. The first input port may be configured to receive a reference current. The second input port may be configured to receive the total synaptic driving current. The output port may be configured to output a second voltage signal. The control voltage generator may be configured to receive the second voltage signal and produce the feedback voltage.

The control voltage generator may include a fifth electronic switch, a first voltage module, a second voltage module, a third voltage module and a second capacitor, the fifth electronic switch being electrically connected with the first voltage module, the second voltage module, the third voltage module and the second capacitor. The first voltage module may be configured to provide a first comparison voltage for the fifth electronic switch. The second voltage module may be configured to provide a second comparison voltage for the fifth electronic switch. The third voltage module may be configured to control conducting state of the fifth electronic switch. The second capacitor may be configured to output the feedback voltage. When the first comparison voltage may be greater than the second comparison voltage, the second capacitor may be controlled by the fifth electronic switch to be charged. When the first comparison voltage may be lower than the second comparison voltage, the fifth electronic switch may control the second capacitor to be discharged so as to control the feedback voltage to vary slowly.

The first voltage module may include a sixth electronic switch, a seventh electronic switch, a first amplifier and an eighth electronic switch. The second voltage module may include a second amplifier. The third voltage module may include a ninth electronic switch. The fifth electronic switch, the sixth electronic switch, the eighth electronic switch and the ninth electronic switch may be P-type Metal-Oxide Semiconductor Field Effect Transistors. The seventh electronic switch may be an N-type Metal-Oxide Semiconductor Field Effect Transistor. The source electrode of the fifth electronic switch may be electrically connected with the first voltage module. The drain electrode of the fifth electronic switch may be electrically connected with the second voltage module and the second capacitor. The gate electrode of the fifth electronic switch may be electrically connected with the third voltage module. The gate electrode of the sixth electronic switch may receive the second voltage signal. The source electrode of the sixth electronic switch may receive a first predetermined voltage. The drain electrode of the sixth electronic switch may be electrically connected with the positive input port of the first amplifier. The gate electrode of the seventh electronic switch may receive the second voltage signal. The drain electrode of the seventh electronic switch may receive a second predetermined voltage. The source electrode of the seventh electronic switch may be electrically connected with the positive input port of the first amplifier. The negative input port of the first amplifier may be electrically connected with the output port of the first amplifier and the source electrode of the eighth electronic switch.

The gate electrode of the eighth electronic switch may receive a reset voltage; the drain electrode of the eighth electronic switch may be electrically connected with the source electrode of the fifth electronic switch. The negative input port of the second amplifier may be electrically connected with the drain electrode of the fifth electronic switch; the positive input port of the second amplifier may receive a reference voltage; the output port of the second amplifier may be electrically connected with a port of the second capacitor which outputs the feedback voltage. The gate electrode of the ninth electronic switch may receive the reset voltage; the source electrode of the ninth electronic switch may receive a second biasing voltage; the drain electrode of the ninth electronic switch may be electrically connected with the gate electrode of the fifth electronic switch.

The control voltage generator may further include a reset module. The reset module may be electrically connected with the second capacitor and configured to discharge the second capacitor completely so as to deplete the charges of the second capacitor and reset the second capacitor. The reset module may include a tenth electronic switch and an eleventh electronic switch. The tenth electronic switch may be an N-type Metal-Oxide Semiconductor Field Effect Transistor while the eleventh electronic switch may be a P-type Metal-Oxide Semiconductor Field Effect Transistor. The gate electrode of the tenth electronic switch may receive the reset voltage, the source electrode of the tenth electronic switch may be connected to the ground, and the drain electrode of the tenth electronic switch may be electrically connected with the gate electrode of the fifth electronic switch. The gate electrode of the eleventh electronic switch may receive a reversed voltage of the reset voltage, the source electrode of the eleventh electronic switch may be electrically connected with the source electrode of the fifth electronic switch, the drain electrode of the eleventh electronic switch may be electrically connected with a port of the second capacitor which outputs the feedback voltage. When the tenth electronic switch and the eleventh electronic switch may be conducted, the second capacitor may be discharged. When discharging of the second capacitor may be finished, the tenth electronic switch and the eleventh electronic switch may be disconnected.

DETAILED DESCRIPTION

Reference will now be made in detail to a preferred embodiment of the homeostatic circuit for neural networks disclosed in the present patent application, examples of which are also provided in the following description. Exemplary embodiments of the homeostatic circuit for neural networks disclosed in the present patent application are described in detail, although it will be apparent to those skilled in the relevant art that some features that are not particularly important to an understanding of the homeostatic circuit for neural networks may not be shown for the sake of clarity.

Furthermore, it should be understood that the homeostatic circuit for neural networks disclosed in the present patent application is not limited to the precise embodiments described below and that various changes and modifications thereof may be effected by one skilled in the art without departing from the spirit or scope of the protection. For example, elements and/or features of different illustrative embodiments may be combined with each other and/or substituted for each other within the scope of this disclosure.

Figure 1:
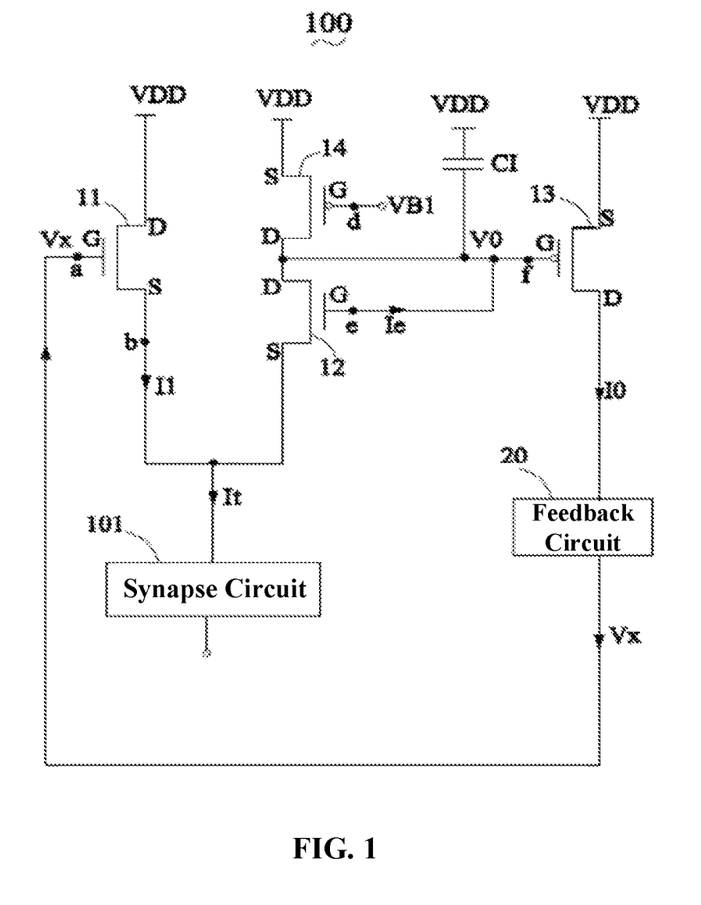
FIG. 1 is a schematic circuit diagram of a homeostatic circuit for neural networks in accordance with an embodiment of the present patent application.

FIG. 1 is a schematic circuit diagram of a homeostatic circuit for neural networks in accordance with an embodiment of the present patent application. The homeostatic circuit 100 for neural networks is configured to keep a total synaptic driving current I0 in a predetermined range around an optimal operating point, while not affecting the signal processing and learning mechanism of the neural network. Referring to FIG. 1, the homeostatic circuit 100 for neural networks includes a synapse circuit 101, a feedback circuit 20, a first electronic switch 11, a second electronic switch 12, a third electronic switch 13 and a first capacitor CI.

The synapse circuit 101 is configured to receive a total weighted current It for all synapses and split the total weighted current It into multiple local currents, each local current corresponding to each synapse, so as to transmit the local currents to the corresponding synapses respectively. The local current of each synapse varies with the signal processing and learning mechanism of the neural network.

The feedback circuit 20 is configured to receive the total synaptic driving current I0 and output a feedback voltage Vx which varies with the total synaptic driving current I0. The total synaptic driving current I0 represents the overall degree of activity of a neuron, which has global effects and varies with the external environment. The variation of the total synaptic driving current I0 is relatively independent from the variation of the input current It of the synapse circuit 101.

The first electronic switch 11 is electronically connected with the synapse circuit 101 and the second electronic switch 12 and configured to receive the feedback voltage Vx and output a current control signal I1 according to the feedback voltage Vx. The second electronic switch 12 is electrically connected with the synapse circuit 101 and the third electronic switch 13 and configured to output a first voltage signal V0 according to the current control signal I1. The third electronic switch 13 is configured to adjust the total synaptic driving current I0 in a direction opposite to the variation tendency of the total synaptic driving current I0 according to the first voltage signal V0 so as to keep the total synaptic driving current I0 in the predetermined range. One port of the first capacitor CI is electrically connected with a power supply voltage VDD while the other port of the first capacitor CI is electrically connected with the third electronic switch 13. The total synaptic driving current I0 is produced by the integrating effect of the homeostatic circuit 100 for neural networks through the first capacitor CI and eventually directed to a neural network circuit (not shown in the figures) so that a neuron signal is produced based on the total synaptic driving current I0.

In this embodiment, the variation tendencies of the feedback voltage Vx, the current control signal I1 and the first voltage signal V0 are the same as that of the total synaptic driving current I0.

The homeostatic circuit 100 for neural networks further includes a fourth electronic switch 14. The fourth electronic switch 14 is electrically connected with the second electronic switch 12 and configured to provide a constant current for the second electronic switch 12, so that the variation tendency of the first voltage signal V0 is the same as that of the current control signal I1.

In this embodiment, the first electronic switch 11 and the second electronic switch 12 are N-type Metal-Oxide Semiconductor Field Effect Transistors while the third electronic switch 13 and the fourth electronic switch 14 are P-type Metal-Oxide Semiconductor Field Effect Transistors, each including a gate electrode, a drain electrode and a source electrode.

The gate electrode of the first electronic switch 11 is electrically connected with the feedback circuit 20, the drain electrode of the first electronic switch 11 being electrically connected with a power supply voltage VDD, and the source electrode of the first electronic switch 11 being electrically connected with the synapse circuit 101. The gate electrode of the second electronic switch 12 is electrically connected with the gate electrode of the third electronic switch 13, the drain electrode of the second electronic switch 12 being electrically connected with the drain electrode of the fourth electronic switch 14 and the source electrode of the second electronic switch 12 being electrically connected with the synapse circuit 101. The drain electrode of the third electronic switch 13 is electrically connected with the feedback circuit 20 while the source electrode of the third electronic switch 13 is electrically connected with the power supply voltage VDD. The gate electrode of the fourth electronic switch 14 is electrically connected with a first biasing voltage VB1 while the source electrode of the fourth electronic switch 14 is electrically connected with the power supply voltage VDD.

The working principle of the homeostatic circuit 100 for neural networks is as follows: when the total synaptic driving current I0 increases and I0 is greater than a reference current IR, the feedback voltage Vx produced by the feedback circuit 20 increases so that I0 decreases (suppressing the increase of I0 and reducing I0 to IR); when the total synaptic driving current I0 decreases and I0 is lower than the reference current IR, the feedback voltage Vx produced by the feedback circuit 20 decreases so that I0 increases (suppressing the decrease of I0 and increasing I0 to IR). The aforementioned process is slow and takes a relatively long time to finish.

In order to make it convenient to describe the working process, reference points a, b, d, e and f are referred to in the homeostatic circuit 100 for neural networks, wherein the reference point a is set at the gate electrode of the first electronic switch 11, the reference point b being set at the source electrode of the first electronic switch 11, the reference point d being set at the gate electrode of the fourth electronic switch 14, the reference point e being set at the gate electrode of the second electronic switch 12, and the reference point f being set at the gate electrode of the third electronic switch 13.

Specifically, when the total synaptic driving current I0 increases, the feedback voltage Vx increases. As a result, Va increases and Ib increases. Since the voltage VB1 of the reference point d is constant, the voltage difference VDD-VB1 between the source electrode and the gate electrode of the fourth electronic switch 14 is constant, so that the current flowing through the fourth electronic switch 14 to the second electronic switch 12 is constant. Therefore, when Ib increases, Ie inevitably increases, and therefore the first voltage signal V0 increases which leads to the increase of Vf. As a result, the voltage difference VDD-Vf between the source electrode and the gate electrode of the third electronic switch 13 decreases, which reduces the current I0 flowing through the drain electrode of the third electronic switch 13 to the reference current IR. And vice versa, when the total synaptic driving current I0 decreases, the feedback voltage Vx decreases and therefore Va and Ib decrease which leads to the decrease of Ie. As a result, the first voltage signal V0 decreases which leads to the decrease of Vf and therefore VDD-Vf increases, which increases the current I0 flowing through the drain electrode of the third electronic switch 13 to the reference current IR.

Figure 2:
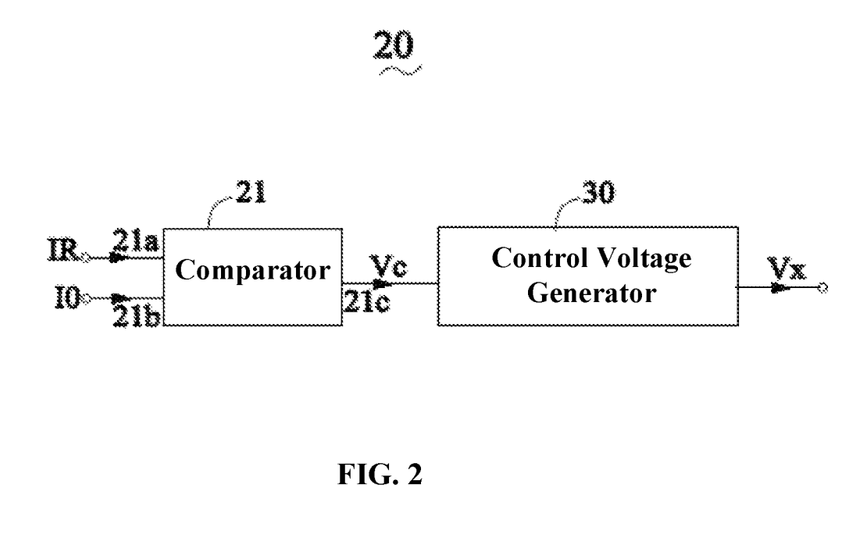
FIG. 2 is a schematic circuit diagram of a feedback circuit of the homeostatic circuit for neural networks as depicted in FIG. 1.

Referring to FIG. 2, the feedback circuit 20 includes a comparator 21 and a control voltage generator 30 which are electrically connected with each other.

The comparator 21 includes a first input port 21a, a second input port 21b and an output port 21c. The first input port 21a is configured to receive the reference current IR and the second input port 21b is configured to receive the total synaptic driving current I0 and the output port 21c is configured to output a second voltage signal Vc.

The working principle of the feedback circuit 20 is: when I0 is greater than IR, Vc=1 and the feedback voltage Vx increases; when I0 is lower than IR, Vc=0 and the feedback voltage Vx decreases.

Figure 3:
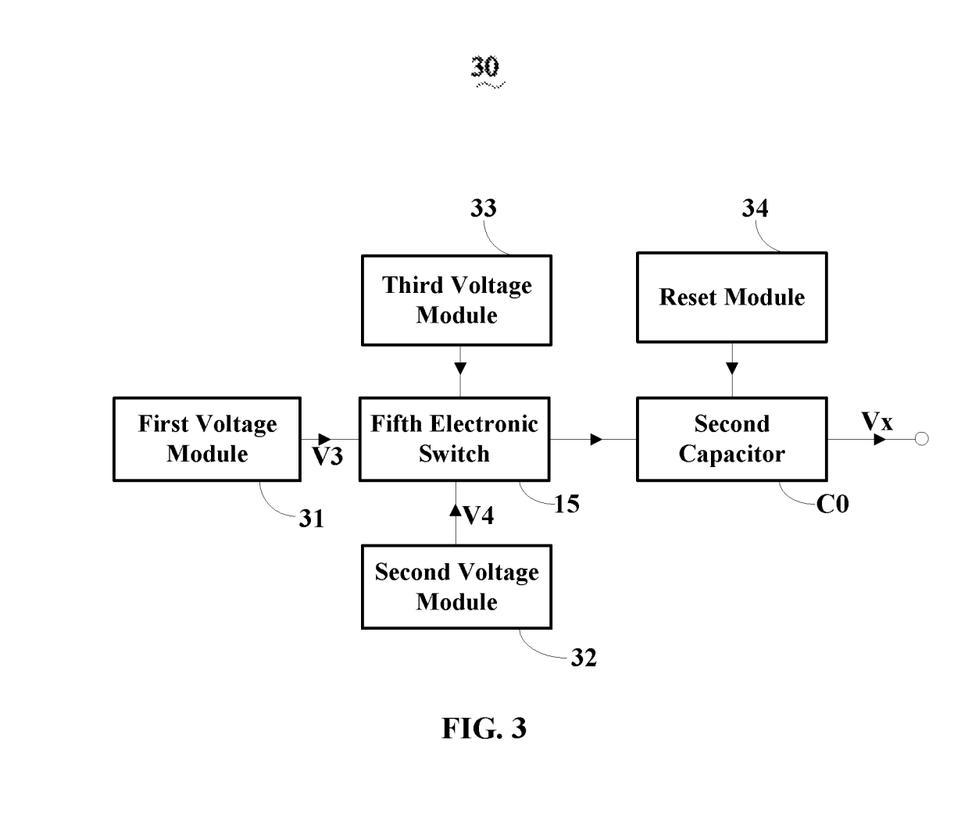
FIG. 3 is a block diagram of a control voltage generator of the homeostatic circuit for neural networks as depicted in FIG. 1.

Referring to FIG. 3, the control voltage generator 30 is configured to receive the second voltage signal Vc and produce the feedback voltage Vx. The control voltage generator 30 includes a fifth electronic switch 15, a first voltage module 31, a second voltage module 32, a third voltage module 33 and a second capacitor C0. The fifth electronic switch 15 is electrically connected with the first voltage module 31, the second voltage module 32, the third voltage module 33 and the second capacitor C0.

The first voltage module 31 is configured to provide a first comparison voltage V3 for the fifth electronic switch 15. The second voltage module 32 is configured to provide a second comparison voltage V4 for the fifth electronic switch 15. The third voltage module 33 is configured to control the conducting state of the fifth electronic switch 15. The second capacitor C0 is configured to output the feedback voltage Vx. When the first comparison voltage V3 is greater than the second comparison voltage V4, the second capacitor C0 is controlled by the fifth electronic switch 15 to be charged. When the first comparison voltage V3 is lower than the second comparison voltage V4, the fifth electronic switch 15 controls the second capacitor C0 to be discharged so as to control the feedback voltage Vx to vary slowly.

Figure 4:
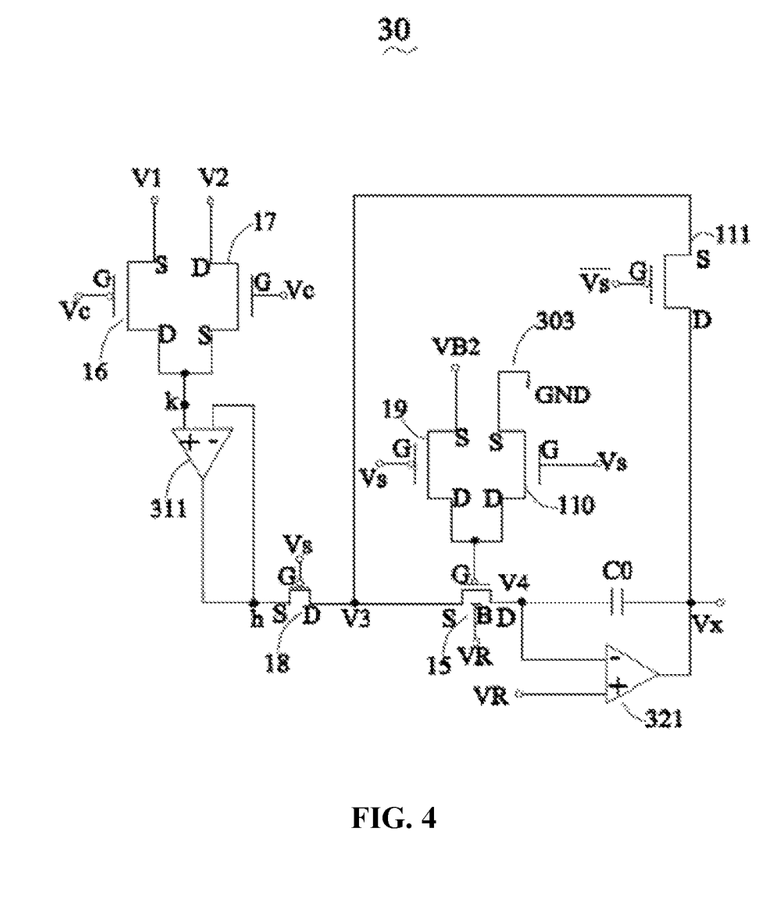
FIG. 4 is a schematic circuit diagram of the control voltage generator as depicted in FIG. 3.

Referring to FIG. 4, the first voltage module 31 includes a sixth electronic switch 16, a seventh electronic switch 17, a first amplifier 311 and an eighth electronic switch 18. The second voltage module 32 includes a second amplifier 321. The third voltage module 33 includes a ninth electronic switch 19.

In this embodiment, the fifth electronic switch 15, the sixth electronic switch 16, the eighth electronic switch 18 and the ninth electronic switch 19 are P-type Metal-Oxide Semiconductor Field Effect Transistors while the seventh electronic switch 17 is an N-type Metal-Oxide Semiconductor Field Effect Transistor.

The source electrode of the fifth electronic switch 15 is electrically connected with the first voltage module 31, the drain electrode of the fifth electronic switch 15 being electrically connected with the second voltage module 32 and the second capacitor C0, and the gate electrode of the fifth electronic switch 15 being electrically connected with the third voltage module 33. The gate electrode of the sixth electronic switch 16 receives the second voltage signal Vc, the source electrode of the sixth electronic switch 16 receives a first predetermined voltage V1, and the drain electrode of the sixth electronic switch 16 is electrically connected with the positive input port of the first amplifier 311. The gate electrode of the seventh electronic switch 17 receives the second voltage signal Vc, the drain electrode of the seventh electronic switch 17 receives a second predetermined voltage V2, and the source electrode of the seventh electronic switch 17 is electrically connected with the positive input port of the first amplifier 311. The negative input port of the first amplifier 311 is electrically connected with the output port of the first amplifier 311 and the source electrode of the eighth electronic switch 18. The gate electrode of the eighth electronic switch 18 receives a reset voltage VS while the drain electrode of the eighth electronic switch 18 is electrically connected with the source electrode of the fifth electronic switch 15. The negative input port of the second amplifier 321 is electrically connected with the drain electrode of the fifth electronic switch 15, the positive input port of the second amplifier 321 receives a reference voltage VR, and the output port of the second amplifier 321 is electrically connected with one port of the second capacitor C0 which outputs the feedback voltage Vx. The gate electrode of the ninth electronic switch 19 receives the reset voltage VS, the source electrode of the ninth electronic switch 19 receives a second biasing voltage VB2, and the drain electrode of the ninth electronic switch 19 is electrically connected with the gate electrode of the fifth electronic switch 15.

In addition, referring to FIG. 3, the control voltage generator 30 further includes a reset module 34. The reset module 34 is electrically connected with the second capacitor C0 and configured to discharge the second capacitor C0 completely so as to deplete the charges of the second capacitor C0 and reset the second capacitor C0.

Referring to FIG. 4, the reset module 34 includes a tenth electronic switch 110 and an eleventh electronic switch 111.

In this embodiment, the tenth electronic switch 110 is an N-type Metal-Oxide Semiconductor Field Effect Transistor and the eleventh electronic switch 111 is a P-type Metal-Oxide Semiconductor Field Effect Transistor.

The gate electrode of the tenth electronic switch 110 receives the reset voltage VS, the source electrode of the tenth electronic switch 110 is connected to the ground, and the drain electrode of the tenth electronic switch 110 is electrically connected with the gate electrode of the fifth electronic switch 15. The gate electrode of the eleventh electronic switch 111 receives a reversed voltage $\overline{VS}$ of the reset voltage, the source electrode of the eleventh electronic switch 111 is electrically connected with the source electrode of the fifth electronic switch 15, and the drain electrode of the eleventh electronic switch 111 is electrically connected with one port of the second capacitor C0 which outputs the feedback voltage Vx.

The working principle of the reset module 34 is: controlling the conducting state of the tenth electronic switch 110 and the eleventh electronic switch 111 through controlling the reset voltage VS. Specifically, when the homeostatic circuit 100 for neural networks resets, the tenth electronic switch 110 and the eleventh electronic switch 111 are conducted so that the second capacitor C0 is discharged. When discharging of the second capacitor C0 is finished, the homeostatic circuit 100 for neural networks finishes resetting, and the tenth electronic switch 110 and the eleventh electronic switch 111 are disconnected.

To make it convenient to describe, the positive input port of the first amplifier 311 is referred to as a reference point k and the source electrode of the eighth electronic switch 18 is referred to as a reference point h.

The working process of the control voltage generator 30 is: predetermining the values of the first predetermined voltage V1, the second predetermined voltage V2 and the reference voltage VR so that V1>VR>V2. At the very beginning, the reset voltage VS=1 while $\overline{VS}$=0. The tenth electronic switch 110 and the eleventh electronic switch 111 are conducted while the ninth electronic switch 19 is disconnected, so that the gate electrode of the fifth electronic switch 15 is directly connected to the ground and therefore having an electric potential of zero. The fifth electronic switch 15 is conducted so that V3=V4. The second capacitor C0 is discharged and when the second capacitor C0 is discharged completely and reset, the reset voltage VS=0. Since VS=0, $\overline{VS}$=1 so that the eleventh electronic switch 111 is disconnected. At the same time, since the voltages of the gate electrode of the tenth electronic switch 110 and the gate electrode of the ninth electronic switch 19 are VS, after being reset, the tenth electronic switch 110 is disconnected and the ninth electronic switch 19 is conducted, so that the biasing voltage VB2 of the source electrode of the ninth electronic switch 19 is transmitted to the gate electrode of the fifth electronic switch 15 and VG=VB2.

(1) When Vc=1, the sixth electronic switch 16 is disconnected and the seventh electronic switch 17 is conducted, so that Vk=V2. Since the reset voltage VS=0, the eighth electronic switch 18 is conducted and V3=Vh. Under the first amplifier 311 (when the magnification of the first amplifier 311 is very large), V1≈Vh, and in other words, V3≈V2. At the same time, under the second amplifier 321 (when the magnification of the second amplifier 321 is very large), V4≈VR. Since the second biasing voltage VB2 received by the source electrode of the ninth electronic switch 19 is transmitted to the gate electrode of the fifth electronic switch 15, VG=VB2. For the fifth electronic switch 15, the voltage difference between the drain electrode and the source electrode VDS=VD−VS=V4−V3=VR−V2>0. In other words, the voltage VD of the drain electrode of the fifth electronic switch 15 is greater than the voltage VS of the source electrode of the fifth electronic switch 15 while the current flows from the drain electrode to the source electrode. Since the eleventh electronic switch 111 is disconnected, the second capacitor C0 is discharged slowly and the feedback voltage Vx increases slowly.

(2) When VC=0, the sixth electronic switch 16 is conducted and the seventh electronic switch 17 is disconnected, so that Vk=V1. Since the reset voltage VS=0, the eighth electronic switch 18 is conducted and V3=Vh. Under the first amplifier 311, V1≈Vh, and in other words, V3≈V1. At the same time, under the second amplifier 321, V4≈VR. Since the second biasing voltage VB2 received by the source electrode of the ninth electronic switch 19 is transmitted to the gate electrode of the fifth electronic switch 15, VG=VB2. For the fifth electronic switch 15, the voltage difference between the drain electrode and the source electrode VDS=VD−VS=V4−V3=VR−V2<0. In other words, the voltage VD of the drain electrode of the fifth electronic switch 15 is lower than the voltage VS of the source electrode of the fifth electronic switch 15 while the current flows from the source electrode to the drain electrode. Since the eleventh electronic switch 111 is disconnected, the second capacitor C0 is charged slowly and the feedback voltage Vx increases slowly.

From what is mentioned above, the control voltage generator 30 accurately adjusts the flowing direction of the current between the source electrode and the drain electrode of the fifth electronic switch 15 so as to charge or discharge the second capacitor C0 slowly for a long time, and accurately adjusts the intensity of the current between the source electrode and the drain electrode of the fifth electronic switch 15 so as to control the time period for charging and discharging the second capacitor C0. Therefore, in the present patent application, the second biasing voltage VB2 is adjusted to a very small value (i.e. slightly lower than the conducting threshold of the fifth electronic switch 15 which is called "sub threshold" for short), so that the value of the current IDS between the source electrode and the drain electrode of the fifth electronic switch 15 is adjusted to a very small one so as to effectively lengthen the time period for charging and discharging.

Furthermore, the size of a chip in a large-scale integrated neuron is very small, so it requires that the capacitance should be very small (e.g. the capacitance of the second capacitor C0 is 1-10 pF) and the current should be very small. The homeostatic circuit 100 for neural networks can accurately adjust the current IDS between the drain electrode and the source electrode of the fifth electronic switch 15 to a very small value by predetermining the values of V1, V2, VR and VB2, and charge and discharge the second capacitor C0 slowly through IDS so as to lengthen the adjusting time of the homeostatic circuit 100 for neural networks to several hours.

Furthermore, the voltage VDS between the drain electrode and the source electrode of the fifth electronic switch 15 is very small, so it helps to reduce the diffusion of minority carriers.

Furthermore, the fifth electronic switch 15 further includes a bulk electrode and the bulk electrode receives the reference voltage VR. The reference voltage of the bulk electrode of the fifth electronic switch 15 is VR and the voltage of the drain electrode of the fifth electronic switch 15 is V4. Under the second amplifier 321, V4≈VR so that the current IDB between the drain electrode and the bulk electrode of the fifth electronic switch 15 is approximately 0, and in other words, the current between the drain electrode and the bulk electrode of the fifth electronic switch 15 is effectively eliminated and the impact of the current IDB between the drain electrode and the bulk electrode on the current IDS between the drain electrode and the source electrode is reduced so that the accuracy of IDS is effectively controlled.

Furthermore, the oxide layer thickness of the gate electrode of the fifth electronic switch 15 is about 5 nm and the voltage VDG between the gate electrode and the drain electrode of the fifth electronic switch 15 is about 0.5V, so that the density of the leakage current of the gate electrode of the fifth electronic switch 15 is about $10^{-8}$ A/m$^2$ while the leakage current between the gate electrode and the drain electrode of the fifth electronic switch 15 is effectively reduced.

In other words, in the present patent application, the undesired leakage current of the fifth electronic switch 15 (i.e. leakage current between the bulk electrode and the drain electrode and leakage current between the gate electrode and the drain electrode) is eliminated as much as possible and only wanted current is retained (i.e. the current IDS between the source electrode and the drain electrode), so that the charging and discharging current IDS and the time period for charging and discharging can be accurately controlled.

Compared with the conventional homeostatic circuits for neural networks, in the present patent application, the current of the homeostatic circuit for neural networks is very small, so the power consumption is very low. Besides, the homeostatic circuit for neural networks can be implemented with common electronic components with low cost. At the same time, the current is very small, so the capacitance is very low and the size of the chip is very small, which helps to realize large-scale and high density integration with other artificial neural computing systems.

While the present patent application has been shown and described with particular references to a number of embodiments thereof, it should be noted that various other changes or modifications may be made without departing from the scope of the present invention.

What is claimed is:

1. A homeostatic circuit for neural networks configured to keep a total synaptic driving current in a predetermined range around an optimal operating point, the homeostatic circuit for neural networks comprising:
 a feedback circuit;
 a first electronic switch;
 a synapse circuit;
 a second electronic switch;
 a third electronic switch;
 a first capacitor; and
 a fourth electronic switch; wherein:
 the feedback circuit is configured to receive the total synaptic driving current and output a feedback voltage which varies with the total synaptic driving current;
 the first electronic switch is electrically connected with the synapse circuit and the second electronic switch and configured to receive the feedback voltage and output a current control signal according to the feedback voltage;
 the gate electrode of the first electronic switch is electrically connected with the feedback circuit;
 the second electronic switch is electrically connected with the synapse circuit and the third electronic switch and configured to output a first voltage signal according to the current control signal;
 the drain electrode of the third electronic switch is electrically connected with the feedback circuit;
 the third electronic switch is configured to adjust the total synaptic driving current in a direction opposite to variation tendency of the total synaptic driving current according to the first voltage signal so as to keep the total synaptic driving current in the predetermined range;
 one end of the first capacitor is electrically connected with a power supply voltage while the other end of the first capacitor is electrically connected with the third electronic switch;
 the total synaptic driving current is produced by the integrating effect of the homeostatic circuit for neural networks through the first capacitor;
 the fourth electronic switch is electrically connected with the second electronic switch and configured to provide a constant current for the second electronic switch so that variation tendency of the first voltage signal is the same as variation tendency of the current control signal;
 the feedback circuit comprises a comparator and a control voltage generator which are electrically connected with each other;
 the comparator comprises a first input port, a second input port and an output port;
 the first input port is configured to receive a reference current, the second input port being configured to receive the total synaptic driving current and the output port being configured to output a second voltage signal;
 the control voltage generator is configured to receive the second voltage signal and produce the feedback voltage;
 the control voltage generator comprises a fifth electronic switch, a first voltage module, a second voltage module, a third voltage module and a second capacitor, the fifth electronic switch being electrically connected with the first voltage module, the second voltage module, the third voltage module and the second capacitor;

the first voltage module is configured to provide a first comparison voltage for the fifth electronic switch;

the second voltage module is configured to provide a second comparison voltage for the fifth electronic switch;

the third voltage module is configured to control conducting state of the fifth electronic switch;

the second capacitor is configured to output the feedback voltage;

when the first comparison voltage is greater than the second comparison voltage, the second capacitor is controlled by the fifth electronic switch to be charged; and when the first comparison voltage is lower than the second comparison voltage, the fifth electronic switch controls the second capacitor to be discharged so as to control the feedback voltage to vary slowly.

2. The homeostatic circuit for neural networks of claim 1, wherein the first electronic switch and the second electronic switch are N-type Metal-Oxide Semiconductor Field Effect Transistors while the third electronic switch, the fourth electronic switch and the fifth electronic switch are P-type Metal-Oxide Semiconductor Field Effect Transistors.

3. A homeostatic circuit for neural networks configured to keep a total synaptic driving current in a predetermined range around an optimal operating point, the homeostatic circuit for neural networks comprising:
a feedback circuit;
a first electronic switch;
a synapse circuit;
a second electronic switch;
a third electronic switch; and
a first capacitor; wherein:
the feedback circuit is configured to receive the total synaptic driving current and output a feedback voltage varying with the total synaptic driving current;
the first electronic switch is electrically connected with the synapse circuit and the second electronic switch and configured to receive the feedback voltage and output a current control signal according to the feedback voltage;
the gate electrode of the first electronic switch is electrically connected with the feedback circuit;
the second electronic switch is electrically connected with the synapse circuit and the third electronic switch and configured to output a first voltage signal according to the current control signal;
the drain electrode of the third electronic switch is electrically connected with the feedback circuit;
the third electronic switch is configured to adjust the total synaptic driving current in a direction opposite to variation tendency of the total synaptic driving current according to the first voltage signal so as to keep the total synaptic driving current in the predetermined range;
one end of the first capacitor is electrically connected with a power supply voltage while the other end of the first capacitor is electrically connected with the third electronic switch; and
the total synaptic driving current is produced by the integrating effect of the homeostatic circuit for neural networks through the first capacitor.

4. The homeostatic circuit for neural networks of claim 3, wherein variation tendency of the feedback voltage, the current control signal and the first voltage signal is the same as variation tendency of the total synaptic driving current.

5. The homeostatic circuit for neural networks of claim 4 further comprising a fourth electronic switch, wherein the fourth electronic switch is electrically connected with the second electronic switch and configured to provide a constant current for the second electronic switch so that variation tendency of the first voltage signal is the same as variation tendency of the current control signal.

6. The homeostatic circuit for neural networks of claim 5, wherein the first electronic switch and the second electronic switch are N-type Metal-Oxide Semiconductor Field Effect Transistors; the third electronic switch and the fourth electronic switch are P-type Metal-Oxide Semiconductor Field Effect Transistors; the drain electrode of the first electronic switch is electrically connected with a power supply voltage, and the source electrode of the first electronic switch is electrically connected with the synapse circuit; the gate electrode of the second electronic switch is electrically connected with the gate electrode of the third electronic switch, the drain electrode of the second electronic switch being electrically connected with the drain electrode of the fourth electronic switch, and the source electrode of the second electronic switch being electrically connected with the synapse circuit; the source electrode of the third electronic switch is electrically connected with the power supply voltage; the gate electrode of the fourth electronic switch is electrically connected with a first biasing voltage and the source electrode of the fourth electronic switch is electrically connected with the power supply voltage.

7. The homeostatic circuit for neural networks of claim 6, wherein the feedback circuit comprises a comparator and a control voltage generator which are electrically connected with each other; the comparator comprises a first input port, a second input port and an output port; the first input port is configured to receive a reference current; the second input port is configured to receive the total synaptic driving current; the output port is configured to output a second voltage signal; the control voltage generator is configured to receive the second voltage signal and produce the feedback voltage.

8. The homeostatic circuit for neural networks of claim 7, wherein the control voltage generator comprises a fifth electronic switch, a first voltage module, a second voltage module, a third voltage module and a second capacitor, the fifth electronic switch being electrically connected with the first voltage module, the second voltage module, the third voltage module and the second capacitor; the first voltage module is configured to provide a first comparison voltage for the fifth electronic switch; the second voltage module is configured to provide a second comparison voltage for the fifth electronic switch; the third voltage module is configured to control conducting state of the fifth electronic switch; the second capacitor is configured to output the feedback voltage; when the first comparison voltage is greater than the second comparison voltage, the second capacitor is controlled by the fifth electronic switch to be charged; when the first comparison voltage is lower than the second comparison voltage, the fifth electronic switch controls the second capacitor to be discharged so as to control the feedback voltage to vary slowly.

9. The homeostatic circuit for neural networks of claim 8, wherein the first voltage module comprises a sixth electronic switch, a seventh electronic switch, a first amplifier and an eighth electronic switch; the second voltage module comprises a second amplifier; the third voltage module comprises a ninth electronic switch; the fifth electronic switch, the sixth electronic switch, the eighth electronic switch and the ninth electronic switch are P-type Metal-Oxide Semiconductor Field Effect Transistors; the seventh electronic switch is an N-type Metal-Oxide Semiconductor Field Effect Transistor; the source electrode of the fifth electronic switch is electrically connected with the first voltage module; the drain electrode of the fifth electronic switch is electrically connected with the second voltage module and the second capacitor; the gate electrode of the fifth electronic switch is electrically connected with the third voltage module; the gate electrode of the sixth electronic switch receives the second voltage signal; the source electrode of the sixth electronic switch receives a first predetermined voltage; the drain electrode of the sixth electronic switch is electrically connected with the positive input port of the first amplifier; the gate electrode of the seventh electronic switch receives the second voltage signal; the drain electrode of the seventh electronic switch receives a second predetermined voltage; the source electrode of the seventh electronic switch is electrically connected with the positive input port of the first amplifier; the negative input port of the first amplifier is electrically connected with the output port of the first amplifier and the source electrode of the eighth electronic switch; the gate electrode of the eighth electronic switch receives a reset voltage; the drain electrode of the eighth electronic switch is electrically connected with the source electrode of the fifth electronic switch; the negative input port of the second amplifier is electrically connected with the drain electrode of the fifth electronic switch; the positive input port of the second amplifier receives a reference voltage; the output port of the second amplifier is electrically connected with a port of the second capacitor which outputs the feedback voltage; the gate electrode of the ninth electronic switch receives the reset voltage; the source electrode of the ninth electronic switch receives a second biasing voltage; the drain electrode of the ninth electronic switch is electrically connected with the gate electrode of the fifth electronic switch.

10. The homeostatic circuit for neural networks of claim 9, wherein the control voltage generator further comprises a reset module; the reset module is electrically connected with the second capacitor and configured to discharge the second capacitor completely so as to deplete the charges of the second capacitor and reset the second capacitor; the reset module comprises a tenth electronic switch and an eleventh electronic switch; the tenth electronic switch is an N-type Metal-Oxide Semiconductor Field Effect Transistor while the eleventh electronic switch is a P-type Metal-Oxide Semiconductor Field Effect Transistor; the gate electrode of the tenth electronic switch receives the reset voltage, the source electrode of the tenth electronic switch being connected to the ground, and the drain electrode of the tenth electronic switch being electrically connected with the gate electrode of the fifth electronic switch; the gate electrode of the eleventh electronic switch receives a reversed voltage of the reset voltage, the source electrode of the eleventh electronic switch being electrically connected with the source electrode of the fifth electronic switch, the drain electrode of the eleventh electronic switch being electrically connected with a port of the second capacitor which outputs the feedback voltage; when the tenth electronic switch and the eleventh electronic switch are conducted, the second capacitor is discharged; when discharging of the second capacitor is finished, the tenth electronic switch and the eleventh electronic switch are disconnected.

11. A homeostatic circuit for neural networks configured to keep a total synaptic driving current in a predetermined range around an optimal operating point, the homeostatic circuit for neural networks comprising:
 a feedback circuit;
 a first electronic switch;
 a synapse circuit;
 a second electronic switch;
 a third electronic switch; and
 a first capacitor; wherein:
 the first electronic switch is electrically connected with the synapse circuit and the second electronic switch and configured to receive the feedback voltage and output a current control signal according to the feedback voltage;
 the gate electrode of the first electronic switch is electrically connected with the feedback circuit;
 the second electronic switch is electrically connected with the synapse circuit and the third electronic switch and configured to output a first voltage signal according to the current control signal;
 the drain electrode of the third electronic switch is electrically connected with the feedback circuit;
 the third electronic switch is configured to adjust the total synaptic driving current in a direction opposite to variation tendency of the total synaptic driving current according to the first voltage signal so as to keep the total synaptic driving current in the predetermined range; and
 one end of the first capacitor is electrically connected with a power supply voltage while the other end of the first capacitor is electrically connected with the third electronic switch.

12. The homeostatic circuit for neural networks of claim 11, wherein the feedback circuit is configured to receive the total synaptic driving current and output a feedback voltage varying with the total synaptic driving current.

13. The homeostatic circuit for neural networks of claim 11, wherein the total synaptic driving current is produced by the integrating effect of the homeostatic circuit for neural networks through the first capacitor.

14. The homeostatic circuit for neural networks of claim 12, wherein variation tendency of the feedback voltage, the current control signal and the first voltage signal is the same as variation tendency of the total synaptic driving current.

15. The homeostatic circuit for neural networks of claim 14 further comprising a fourth electronic switch, wherein the fourth electronic switch is electrically connected with the second electronic switch and configured to provide a constant current for the second electronic switch so that variation tendency of the first voltage signal is the same as variation tendency of the current control signal.

16. The homeostatic circuit for neural networks of claim 15, wherein the first electronic switch and the second electronic switch are N-type Metal-Oxide Semiconductor Field Effect Transistors; the third electronic switch and the fourth electronic switch are P-type Metal-Oxide Semiconductor Field Effect Transistors; the drain electrode of the first electronic switch is electrically connected with a power supply voltage, and the source electrode of the first electronic switch is electrically connected with the synapse circuit; the gate electrode of the second electronic switch is electrically connected with the gate electrode of the third electronic switch, the drain electrode of the second electronic switch being electrically connected with the drain electrode of the fourth electronic switch, and the source electrode of the second electronic switch being electrically connected with the synapse circuit; the source electrode of the third electronic switch is electrically connected with the power supply voltage; the gate electrode of the fourth electronic switch is electrically connected with a first biasing voltage and the source electrode of the fourth electronic switch is electrically connected with the power supply voltage.

17. The homeostatic circuit for neural networks of claim 16, wherein the feedback circuit comprises a comparator and a control voltage generator which are electrically connected with each other; the comparator comprises a first input port, a second input port and an output port; the first input port is configured to receive a reference current; the second input port is configured to receive the total synaptic driving current; the output port is configured to output a second voltage signal; the control voltage generator is configured to receive the second voltage signal and produce the feedback voltage.

18. The homeostatic circuit for neural networks of claim 17, wherein the control voltage generator comprises a fifth electronic switch, a first voltage module, a second voltage module, a third voltage module and a second capacitor, the fifth electronic switch being electrically connected with the first voltage module, the second voltage module, the third voltage module and the second capacitor; the first voltage module is configured to provide a first comparison voltage for the fifth electronic switch; the second voltage module is configured to provide a second comparison voltage for the fifth electronic switch; the third voltage module is configured to control conducting state of the fifth electronic switch; the second capacitor is configured to output the feedback voltage; when the first comparison voltage is greater than the second comparison voltage, the second capacitor is controlled by the fifth electronic switch to be charged; when the first comparison voltage is lower than the second comparison voltage, the fifth electronic switch controls the second capacitor to be discharged so as to control the feedback voltage to vary slowly.

19. The homeostatic circuit for neural networks of claim 18, wherein the first voltage module comprises a sixth electronic switch, a seventh electronic switch, a first amplifier and an eighth electronic switch; the second voltage module comprises a second amplifier; the third voltage module comprises a ninth electronic switch; the fifth electronic switch, the sixth electronic switch, the eighth electronic switch and the ninth electronic switch are P-type Metal-Oxide Semiconductor Field Effect Transistors; the seventh electronic switch is an N-type Metal-Oxide Semiconductor Field Effect Transistor; the source electrode of the fifth electronic switch is electrically connected with the first voltage module; the drain electrode of the fifth electronic switch is electrically connected with the second voltage module and the second capacitor; the gate electrode of the fifth electronic switch is electrically connected with the third voltage module; the gate electrode of the sixth electronic switch receives the second voltage signal; the source electrode of the sixth electronic switch receives a first predetermined voltage; the drain electrode of the sixth electronic switch is electrically connected with the positive input port of the first amplifier; the gate electrode of the seventh electronic switch receives the second voltage signal; the drain electrode of the seventh electronic switch receives a second predetermined voltage; the source electrode of the seventh electronic switch is electrically connected with the positive input port of the first amplifier; the negative input port of the first amplifier is electrically connected with the output port of the first amplifier and the source electrode of the eighth electronic switch; the gate electrode of the eighth electronic switch receives a reset voltage; the drain electrode of the eighth electronic switch is electrically connected with the source electrode of the fifth electronic switch; the negative input port of the second amplifier is electrically connected with the drain electrode of the fifth electronic switch; the positive input port of the second amplifier receives a reference voltage; the output port of the second amplifier is electrically connected with a port of the second capacitor which outputs the feedback voltage; the gate electrode of the ninth electronic switch receives the reset voltage; the source electrode of the ninth electronic switch receives a second biasing voltage; the drain electrode of the ninth electronic switch is electrically connected with the gate electrode of the fifth electronic switch.

20. The homeostatic circuit for neural networks of claim 19, wherein the control voltage generator further comprises a reset module; the reset module is electrically connected with the second capacitor and configured to discharge the second capacitor completely so as to deplete the charges of the second capacitor and reset the second capacitor; the reset module comprises a tenth electronic switch and an eleventh electronic switch; the tenth electronic switch is an N-type Metal-Oxide Semiconductor Field Effect Transistor while the eleventh electronic switch is a P-type Metal-Oxide Semiconductor Field Effect Transistor; the gate electrode of the tenth electronic switch receives the reset voltage, the source electrode of the tenth electronic switch being connected to the ground, and the drain electrode of the tenth electronic switch being electrically connected with the gate electrode of the fifth electronic switch; the gate electrode of the eleventh electronic switch receives a reversed voltage of the reset voltage, the source electrode of the eleventh electronic switch being electrically connected with the source electrode of the fifth electronic switch, the drain electrode of the eleventh electronic switch being electrically connected with a port of the second capacitor which outputs the feedback voltage; when the tenth electronic switch and the eleventh electronic switch are conducted, the second capacitor is discharged; when discharging of the second capacitor is finished, the tenth electronic switch and the eleventh electronic switch are disconnected.

* * * * *